(12) United States Patent
Zhou et al.

(10) Patent No.: US 11,302,897 B2
(45) Date of Patent: Apr. 12, 2022

(54) DISPLAY PANEL, PREPARATION METHOD THEREOF, AND DISPLAY DEVICE EACH HAVING FIRST WATER OXYGEN BARRIER BAR WITH FIRST AND SECOND SUB-BARRIER BARS SEPARATED FROM EACH OTHER BY GAPS THAT ARE NOT ALIGNED

(71) Applicants: Chengdu BOE Optoelectronics Technology Co., Ltd., Sichuan (CN); BOE TECHNOLOGY GROUP CO., LTD., Beijing (CN)

(72) Inventors: Quanguo Zhou, Beijing (CN); Hao Luo, Beijing (CN)

(73) Assignees: CHENGDUE BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 555 days.

(21) Appl. No.: 16/329,302

(22) PCT Filed: Aug. 20, 2018

(86) PCT No.: PCT/CN2018/101361
§ 371 (c)(1),
(2) Date: Feb. 28, 2019

(87) PCT Pub. No.: WO2019/052314
PCT Pub. Date: Mar. 21, 2019

(65) Prior Publication Data
US 2021/0336218 A1    Oct. 28, 2021

(30) Foreign Application Priority Data
Sep. 18, 2017  (CN) .......................... 201710841812.2

(51) Int. Cl.
*H01L 51/52* (2006.01)
*H01L 27/32* (2006.01)
*H01L 51/56* (2006.01)

(52) U.S. Cl.
CPC ........ *H01L 51/5259* (2013.01); *H01L 27/326* (2013.01); *H01L 51/56* (2013.01)

(58) Field of Classification Search
CPC . H01L 51/524; H01L 51/525; H01L 51/5259; H01L 51/5246; H01L 51/56; H01L 27/326
See application file for complete search history.

(56) References Cited

U.S. PATENT DOCUMENTS 8,350,467 B2    1/2013    Oh et al.
8,716,930 B2    5/2014    Oh et al.
(Continued)

FOREIGN PATENT DOCUMENTS

CN    104952904 A    9/2015
CN    105261712 A    1/2016
(Continued)

OTHER PUBLICATIONS

Search Report and Written Opinion for International Application No. PCT/CN2018/101361 dated Nov. 14, 2018.

*Primary Examiner* — Michael Jung
(74) *Attorney, Agent, or Firm* — Calfee, Halter & Griswold LLP

(57) ABSTRACT

A display panel, a preparation method thereof, and a display device, and relates to the field of display technology are provided. The display panel includes: a substrate; a plurality of illuminating pixels arranged in an array above the substrate and located in the display region; and a first water oxygen barrier bar disposed above the substrate and located in the peripheral region, wherein the first water oxygen barrier bar includes a plurality of first sub-barrier bars (Continued)

arranged intermittently and a plurality of second sub-barrier bars arranged intermittently; in a direction perpendicular to an arrangement direction of the first sub-barrier bars, a gap between adjacent first sub-barrier bars and a gap between adjacent second sub-barrier bars are not aligned with each other.

16 Claims, 8 Drawing Sheets

(56) References Cited

U.S. PATENT DOCUMENTS

| | | | |
|---|---|---|---|
| 2007/0159089 A1* | 7/2007 | Oh | H01L 27/3246 313/506 |
| 2007/0159094 A1 | 7/2007 | Oh et al. | |
| 2007/0159096 A1* | 7/2007 | Oh | H01L 27/3223 313/512 |
| 2012/0235557 A1* | 9/2012 | Lee | H01L 51/5246 313/495 |
| 2013/0093317 A1 | 4/2013 | Oh et al. | |
| 2015/0280170 A1 | 10/2015 | Harikrishna Mohan et al. | |
| 2016/0172327 A1* | 6/2016 | Stagon | H01L 51/56 428/546 |
| 2016/0254478 A1* | 9/2016 | Hartmann | H01L 51/5225 257/40 |
| 2017/0062534 A1 | 3/2017 | Jiang et al. | |
| 2018/0165996 A1* | 6/2018 | Ochi | H05B 33/14 |
| 2020/0091459 A1* | 3/2020 | Senoo | H01L 27/3258 |

FOREIGN PATENT DOCUMENTS

| | | |
|---|---|---|
| CN | 105449123 A | 3/2016 |
| CN | 106450038 A | 2/2017 |
| CN | 107644947 A | 1/2018 |
| CN | 105449123 B | 3/2018 |
| CN | 207124212 U | 3/2018 |
| EP | 2927985 A2 | 10/2015 |
| EP | 2927985 A3 | 11/2015 |

* cited by examiner

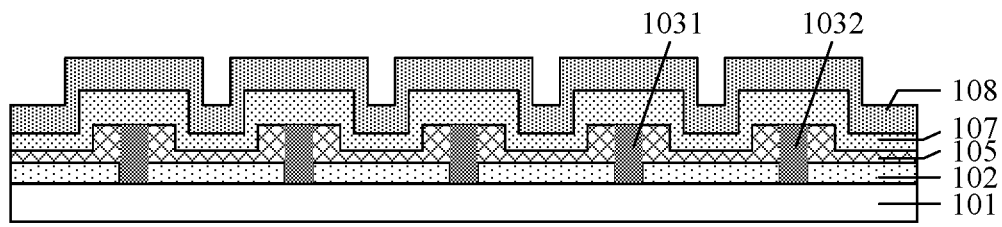
Fig. 15
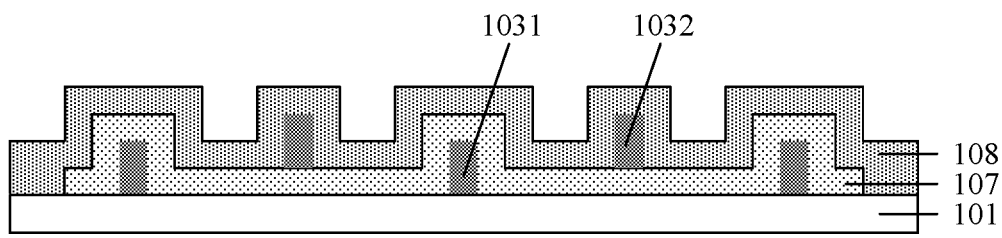
Fig. 16
| Forming a plurality of illuminating pixels 102 arranged in an array in a display region 10a above the substrate 101 | S01 |
| Forming a first water oxygen barrier bar 103 in a peripheral region 10b above the substrate 101 | S02 |
| Forming a second water oxygen barrier bar 104 in a region between adjacent illuminating pixels 102 | S03 |
Fig. 17

DISPLAY PANEL, PREPARATION METHOD THEREOF, AND DISPLAY DEVICE EACH HAVING FIRST WATER OXYGEN BARRIER BAR WITH FIRST AND SECOND SUB-BARRIER BARS SEPARATED FROM EACH OTHER BY GAPS THAT ARE NOT ALIGNED

CROSS REFERENCE OF RELATED APPLICATIONS

The present application is based upon International Application No. PCT/CN2018/101361, filed on Aug. 20, 2018, which claims the priority of Chinese Patent Application No. 201710841812.2, filed on Sep. 18, 2017, and the entire contents thereof are incorporated herein by reference as part of the present application.

TECHNICAL FIELD

The present disclosure relates to the field of display technologies, and in particular, to a display panel, a preparation method thereof, and a display device.

BACKGROUND

An OLED (Organic Light Emitting Diode) is widely used in high-performance display field as a current-type light emitting device duet to advantages such as self-illumination, fast response, wide viewing angle, and manufacturable on flexible substrates. A basic structure of the OLED device may include a cathode, an anode, and an organic light-emitting material layer therebetween. The operating principle is that: under excitation of an electric field, electrons and holes are injected into an organic light-emitting material layer for recombination, thereby realizing a self-luminous function.

The luminescent materials of OLED devices are organic materials, which are quite sensitive to moisture and oxygen, easily react with moisture and oxygen to decompose and degenerate, thereby losing their luminous function. Accordingly, the OLED devices are encapsulated to prevent the penetration of moisture and oxygen It should be noted that the information disclosed in the Background section above is only for enhancing the understanding of the background of the present disclosure, and thus may include information that does not constitute prior art known to those of ordinary skill in the art.

SUMMARY

An object of the present disclosure is to provide a display panel, a preparation method thereof, and a display device.

Other features and advantages of the present disclosure will be apparent from the following detailed description, or learned partly by the practice of the present disclosure.

According to an aspect of the present disclosure, there is provided a display panel, including a display region and a peripheral region; the display panel further including:

a substrate;

a plurality of illuminating pixels arranged in an array above the substrate and located in the display region; and a first water oxygen barrier bar disposed above the substrate and located in the peripheral region, wherein the first water oxygen barrier bar includes a plurality of first sub-barrier bars arranged intermittently and a plurality of second sub-barrier bars arranged intermittently; in a direction perpendicular to an arrangement direction of the first sub-barrier bars, a gap between adjacent first sub-barrier bars and a gap between adjacent second sub-barrier bars are not aligned with each other.

In an exemplary embodiment of the present disclosure, in the direction perpendicular to the arrangement direction of the first sub-barrier bars, the gap between adjacent first sub-barrier bars is aligned with one of the second sub-barrier bars, and the gap between adjacent second sub-barrier bars is aligned with one of the first sub-barrier bars.

In an exemplary embodiment of the present disclosure, the display panel further includes a second water oxygen barrier bar disposed between adjacent illuminating pixels, and the second water oxygen barrier bar and the first water oxygen barrier bar have a substantially identical arrangement.

In an exemplary embodiment of the present disclosure, the first water oxygen barrier bar and the second water oxygen barrier bar are disposed in an identical layer and have an identical material.

In an exemplary embodiment of the present disclosure, the first water oxygen barrier bar completely surrounds the display region.

In an exemplary embodiment of the present disclosure, the second water oxygen barrier bar completely surrounds the illuminating pixels.

In an exemplary embodiment of the present disclosure, the first sub-barrier bar and the second sub-barrier bar have an identical shape and are arranged parallelly and oppositely, wherein the shape of the first sub-barrier bar and the second sub-barrier bar includes any one of a strip type, a C type, and an angle bracket type.

In an exemplary embodiment of the present disclosure, the first sub-barrier bar and the second sub-barrier bar have an identical shape and are arranged successively in an identical row;

wherein the shape of the first sub-barrier bar and the second sub-barrier bar includes any one of an S type and an inverted-Z shape.

In an exemplary embodiment of the present disclosure, the first sub-barrier bar and the second sub-barrier bar are disposed in an identical layer.

In an exemplary embodiment of the present disclosure, the first sub-barrier bar and the second sub-barrier bar are disposed in different layers.

In an exemplary embodiment of the present disclosure, the display panel further includes:

a first water oxygen barrier layer, disposed above the illuminating pixels and located in a region defined by the second water oxygen barrier bar.

In an exemplary embodiment of the present disclosure, a height of the second water oxygen barrier bar is greater than that of the illuminating pixels, and a surface of the second water oxygen barrier bar away from the substrate and a surface of the first water oxygen barrier layer away from the substrate are coplanar.

In an exemplary embodiment of the present disclosure, the display panel further includes:

a second water oxygen barrier layer disposed above the first water oxygen barrier layer.

In an exemplary embodiment of the present disclosure, each of the first water oxygen barrier layer and the second water oxygen barrier bar contains organic materials, and each of the second water oxygen barrier layer and the first water oxygen barrier bar contains inorganic materials.

In an exemplary embodiment of the present disclosure, the display panel further includes:

a third water oxygen barrier layer, disposed above the second water oxygen barrier layer, wherein the third water oxygen barrier layer includes organic materials or inorganic materials.

According to an aspect of the present disclosure, there is provided a display device, including the display panel described above.

According to an aspect of the present disclosure, there is provided a method of preparing a display panel, including:

forming a plurality of illuminating pixels arranged in an array in a display region above a substrate;

forming a first water oxygen barrier bar in a peripheral region above the substrate, wherein the first water oxygen barrier bar includes a plurality of first sub-barrier bars arranged intermittently and a plurality of second sub-barrier bars arranged intermittently; in a direction perpendicular to an arrangement direction of the first sub-barrier bars, a gap between adjacent first sub-barrier bars and a gap between adjacent second sub-barrier bars are not aligned with each other.

In an exemplary embodiment of the present disclosure, the gap between adjacent first sub-barrier bars is formed to be aligned with one of the second sub-barrier bars, and the gap between adjacent second sub-barrier bars is formed to be aligned with one of the first sub-barrier bars.

In an exemplary embodiment of the present disclosure, the preparation method further includes:

forming a second water oxygen barrier bar in a region between adjacent illuminating pixels, wherein the second water oxygen barrier bar and the first water oxygen barrier bar have a substantially identical arrangement.

In an exemplary embodiment of the present disclosure, the first water oxygen barrier bar and the second water oxygen barrier bar are formed by an identical patterning process.

It should be understood that the above general description and the following detailed description are only intended to be exemplary and illustrative, and not restrictive to the present disclosure.

This section provides an overview of various implementations or examples of the techniques described in the present disclosure, and is not a comprehensive disclosure of all scopes or all features of the disclosed technology.

BRIEF DESCRIPTION OF THE DRAWINGS

The drawings herein are incorporated into the specification and form a part of this specification, which show embodiments according with the present disclosure, and serve to explain principles of the present disclosure in conjunction with the specification. Obviously, the drawings in the following description are only certain embodiments of the present disclosure, and other drawings can be obtained from those skilled in the art based on these drawings without any creative work.

FIG. 15 is a schematic view showing a second arrangement of a water oxygen barrier bar in an exemplary embodiment of the present disclosure;

FIG. 16 is a schematic view showing a third arrangement of a water oxygen barrier bar in an exemplary embodiment of the present disclosure;

FIG. 17 is a schematic view showing a method of preparing an OLED display panel in an exemplary embodiment of the present disclosure;

DETAILED DESCRIPTION

Figure 1:
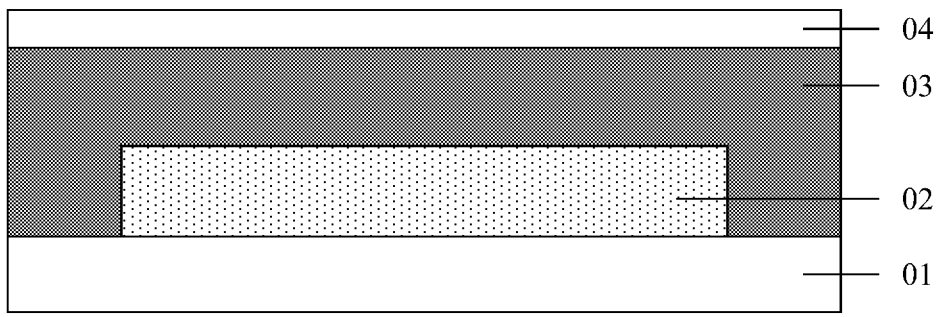
FIG. 1 is a schematic view showing a package structure of an OLED display panel.

Example embodiments will now be described more fully with reference to the accompanying drawings. However, the example embodiments can be embodied in a variety of forms and should not be construed as being limited to the examples set forth herein; rather, these embodiments are provided so that this disclosure will be more complete and complete, and concepts of the example embodiments are fully conveyed to those skilled in the art. The described features, structures, or characteristics may be combined in any suitable manner in one or more embodiments. In the following description, numerous specific details are set forth to provide full understanding of embodiments of the present disclosure. However, one skilled in the art will appreciate that one or more of the specific details may be omitted or other methods, components, devices, steps, etc. may be employed. In other instances, well-known technical solutions are not shown or described in detail to avoid obscuring aspects of the disclosure. However, those skilled in the art will appreciate that the technical solution of the present disclosure may be practiced and one or more of the specific details may be omitted, or other methods, components, devices, steps, etc. may be employed. In other instances, well-known technical solutions are not shown or described in detail to avoid obscuring aspects of the present disclosure.

In addition, the drawings are merely schematic representations of the present disclosure and are not necessarily drawn to scale. The thicknesses and shapes of the various layers in the drawings do not reflect true proportions, only for the purpose of illustrating the present disclosure. The same reference numerals in the drawings denote the same or similar parts, and the repeated description thereof will be omitted.

FIG. 1 is a schematic view showing a package structure of an OLED display panel. In the package structure, cover plate packaging or thin film packaging is performed on the OLED device 02 to obtain an encapsulation layer 03, and then a protective film 04 is covered to achieve an effect of preventing moisture and oxygen from penetrating. However, the above packaging method has a problem of poor bending resistance performance. When the OLED display panel is subjected to a bending stress, especially when a flexible panel is bent or curled, the encapsulation layer 03 is prone to generating cracks to cause failure of preventing water and oxygen.

Figure 2:
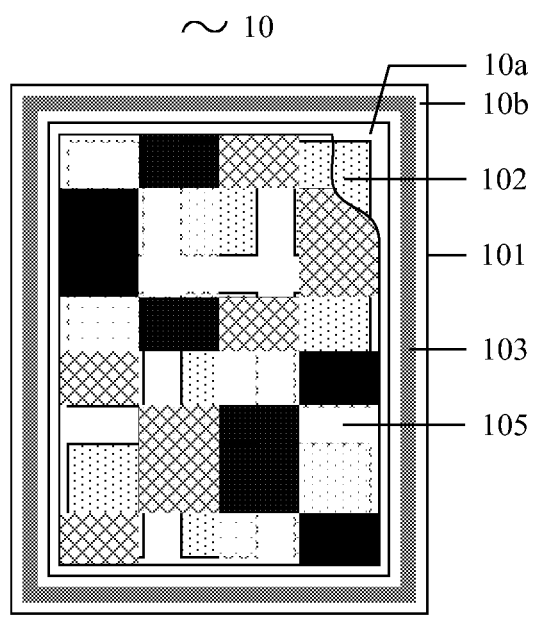
FIG. 2 is a schematic view showing a planar structure of an OLED display panel in an exemplary embodiment of the present disclosure.

Based on this, the present exemplary embodiment provides a display panel 10, as shown in FIG. 2, the display panel 10 may include:

a substrate 101;

a plurality of illuminating pixels 102 arranged in an array above the substrate 101 and located in the display region 10a (e.g., an effective display region); and a first water oxygen barrier bar 103 disposed above the substrate 101 and located in the peripheral region 10b.

In the embodiment, as shown in FIG. 3 to FIG. 7, the first water oxygen barrier bar 103 may include a plurality of first sub-barrier bars 1031 arranged intermittently and a plurality of second sub-barrier bars 1032 arranged intermittently, and the first sub-barrier bars 1031 and the second sub-barrier bars 1032 are interlaced with each other. In a direction perpendicular to an arrangement direction of the first sub-barrier bars 1031, a gap between adjacent first sub-barrier bars 1031 is blocked by one of the second sub-barrier bars 1032, and a gap between adjacent second sub-barrier bars 1032 is blocked by one of the first sub-barrier bars 1031. In other words, in a direction perpendicular to an arrangement direction of the first sub-barrier bars 1031, a gap between adjacent first sub-barrier bars 1031 and a gap between adjacent second sub-barrier bars 1032 are not aligned with each other.

In an embodiment of the present disclosure, one element is "blocked" by another element may refer to the case where in this direction, a line passing through the one element also passes through the other element at the same time. In other words, in the foregoing embodiment, in the direction perpendicular to an arrangement direction of the first sub-barrier bars 1031, the gap between adjacent first sub-barrier bars 1031 is aligned with one of the second sub-barrier bars 1032, and the gap between adjacent second sub-barrier bars 1032 is aligned with one of the first sub-barrier bars 1031.

In the OLED display panel provided by the exemplary embodiment of the present disclosure, by providing a first water oxygen barrier bar 103 composed of alternatively arranged first sub-barrier bars 1031 and second sub-barrier bars 1032 in a peripheral region, a water oxygen blocking structure can be constructed for a side of the OLED device. On the one hand, since the first water oxygen barrier bar 103 is disposed in the peripheral region of the display panel, capability of resisting water and oxygen at a side of the OLED device can be effectively improved; on the other hand, the first sub-barrier bars 1031 and the second sub-barrier bars 1032 are all intermittent structures, so the water oxygen blocking structure can be effectively prevented from being warped or cracked due to the bending stress, thereby improving the service life of the OLED device.

Figure 8:
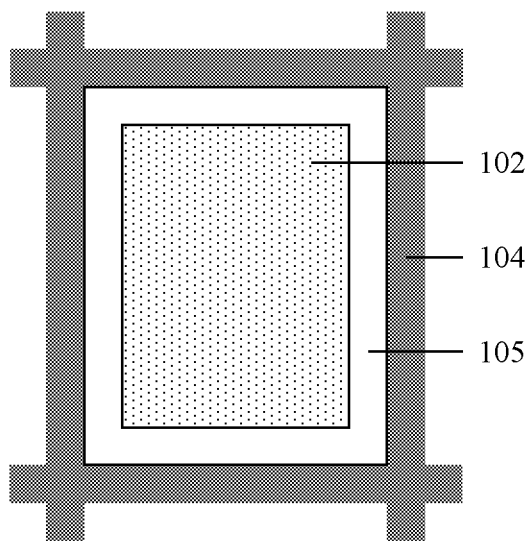
FIG. 8 is a schematic view showing a planar structure of an OLED display panel in another exemplary embodiment of the present disclosure.

In the exemplary embodiment, as shown in FIG. 8, the display panel may further include a second water oxygen barrier bar 104 disposed between adjacent illuminating pixels 102, and the second water oxygen barrier bar 104 may have the same structure as the first water oxygen barrier bar 103.

It should be understood that, in the present disclosure, "the second water oxygen barrier bar 104 may have the same (or identical) structure as the first water oxygen barrier bar 103" may represent that the second water oxygen barrier bar 104 may have substantially the same arrangement as the first water oxygen barrier bar 103, and should not be construed as requiring them two to have totally the same structural feature.

Based on this, in consideration of simplification of the preparation process, the first water oxygen barrier bar 103 and the second water oxygen barrier bar 104 may be disposed in an identical layer and have an identical material. That is, the first water oxygen barrier bar 103 and the second water oxygen barrier bar 104 can be prepared by the same patterning process.

Figure 3:
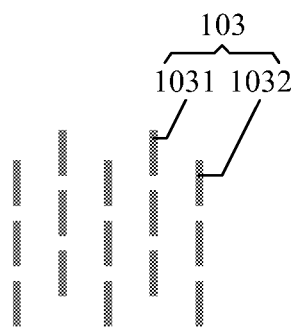
FIG. 3 is a first schematic view showing a shape of a water oxygen barrier bar in an exemplary embodiment of the present disclosure.
Figure 4:
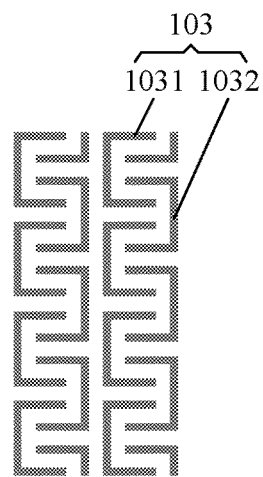
FIG. 4 is a second schematic view showing a shape of a water oxygen barrier bar in an exemplary embodiment of the present disclosure.
Figure 5:
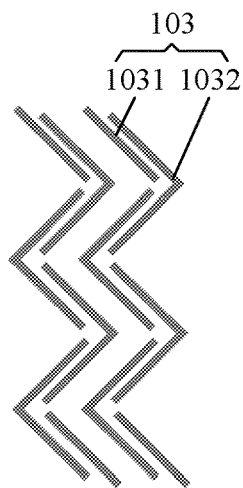
FIG. 5 is a third schematic view showing a shape of a water oxygen barrier bar in an exemplary embodiment of the present disclosure.

In an embodiment of the present example, referring to FIG. 3 to FIG. 5, the first sub-barrier bar 1031 and the second sub-barrier bar 1032 may have an identical shape and are arranged parallelly and oppositely. Specifically, the shape of the first sub-barrier bar 1031 and the second sub-barrier bar 1032 may include any one of a strip type, a C type, and an angle bracket type, and not limited thereto. The barrier bar of this type requires two rows of staggered adjacent barrier bars to achieve a good effect to resist water and oxygen.

In the embodiment, "arranged parallelly and oppositely" may refer to the case where: on the one hand, an arrangement direction of the plurality of first sub-barrier bars 1031 is the same as and adjacent to that of the plurality of second sub-barrier bars 1032, that is, arranged parallelly; on the other hand, the first sub-barrier bar 1031 and the second sub-barrier bar 1032 are disposed opposite to each other, that is, the structure is symmetrical. It should be noted that since the first sub-barrier bars 1031 and the second sub-barrier bars 1032 are staggered, they are not exactly mirror-symmetrical, but are symmetrically in shape along a mirror surface while arranged with one at a higher position and one at lower positon.

For example, referring to FIG. 4, when the shape of the first sub-barrier bars 1031 and second sub-barrier bars 1032 is a C type, the first sub-barrier bars 1031 can be intermittently arranged in a first column and open to the right, the second sub-barrier bars 1032 can be intermittently arranged in a second column and open to the left, and the first sub-barrier bars 1031 and the second sub-barrier bars 1032 are offset from each other, such that the gap between adjacent first sub-barrier bars 1031 is blocked by one of the second sub-barrier bars 1032, and the gap between adjacent second sub-barrier bars 1032 is blocked by one of the first sub-barrier bars 1031. In this way, the first water oxygen barrier bar 103 at the side of the OLED device will not weaken its capability of blocking water and oxygen due to the presence of a gap, and meanwhile the intermittent arrangement further facilitates preventing the water oxygen blocking structure from being warped or cracked due to the bending stress, which can effectively isolate the invasion of moisture and oxygen.

Based on the shape of the barrier bar described above, the present exemplary embodiment may provide a plurality of sets of mutually spaced first water oxygen barrier bars 103, to further improve the capability of resisting water and oxygen at a side of the OLED device. In the embodiment, a distance between the adjacent two sets of first water oxygen barrier bars 103 may be set in a range of several micrometers to several tens of micrometers, and each set of first water oxygen barrier bar 03 is constituted by first sub-barrier bars 1031 and second sub-barrier bars 1032 arranged parallelly and oppositely, a spacing between adjacent first sub-barrier bars 1031 in the same row and a spacing between adjacent second sub-barrier bars 1032 in the same row may be set in the range of several hundred nanometers to several tens of micrometers.

Figure 6:
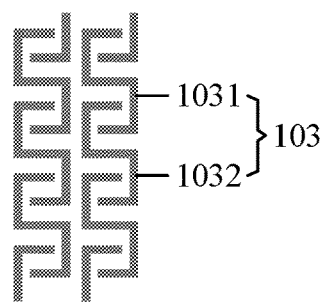
FIG. 6 is a fourth schematic view showing a shape of a water oxygen barrier bar in an exemplary embodiment of the present disclosure.
Figure 7:
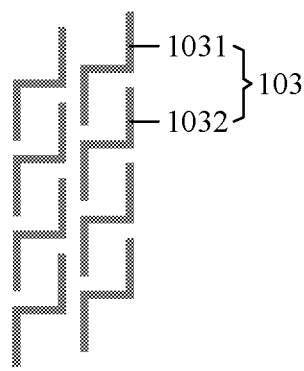
FIG. 7 is a fifth schematic view showing a shape of a water oxygen barrier bar in an exemplary embodiment of the present disclosure.

In another embodiment of the present example, as shown in FIG. 6 to FIG. 7, the first sub-barrier bar 1031 and the second sub-barrier bar 1032 have an identical shape and are arranged successively in an identical row. Specifically, the shape of the first sub-barrier bar 1031 and the second sub-barrier bar 1032 may include any one of an S type and an inverted-Z shape, and not limited thereto. The barrier bar of this shape only needs to provide a row of barrier bars arranged alternately, in order to achieve a preferable effect to resist water and oxygen.

In the embodiment, "arranged successively in an identical row" may refer to the case where: the first sub-barrier bars 1031 and the second sub-barrier bars 1032 are located in the same row and are arranged in the same direction, and the first sub-barrier bar 1031 is interspersed between adjacent second sub-barrier bars 1032, and the second sub-barrier 1032 is interspersed between adjacent first sub-barriers 1031.

For example, referring to FIG. 6, when the first sub-barrier bar 1031 and the second sub-barrier bar 1032 are S-shaped, the first sub-barrier bar 1031 may be disposed between adjacent second sub-barrier bars 1032, so that the gap between the adjacent second sub-barrier bars 1032 can be filled by the first sub-barrier bar 1031, and the second sub-barrier bar 1032 can be disposed between adjacent first sub-barrier bars 1031, so that the gap between the adjacent first sub-barrier bars 1031 can be filled by the second sub-barrier 1032. In this way, the first water oxygen barrier bar 103 at the side of the OLED device will not weaken its capability of blocking water and oxygen due to the presence of a gap, and meanwhile the intermittent arrangement further facilitates preventing the water oxygen blocking structure from being warped or cracked due to the bending stress, which can effectively isolate the invasion of moisture and oxygen.

Based on the shape of the barrier bar described above, the present exemplary embodiment may provide a plurality of sets of mutually spaced first water oxygen barrier bars 103, to further improve the capability of resisting water and oxygen at a side of the OLED device. In the embodiment, a distance between adjacent two sets of first water oxygen barrier bars 103 may be set in a range of several micrometers to several tens of micrometers, and each first water oxygen barrier bar 103 includes first sub-barrier bars 1031 and second sub-barrier bars 1032 arranged alternatively, a spacing between adjacent first sub-barrier bars 1031 and a spacing between adjacent second sub-barrier bars 1032 may be set in the range of several hundred nanometers to several tens of micrometers.

It should be noted that, in this embodiment, a second water oxygen barrier bar 104 is further disposed between adjacent illuminating pixels 102. The structure of the second water oxygen barrier bar 104 may be the same as that of the first water oxygen barrier bar 103. Alternatively, the structure of the second water oxygen barrier bar 104 may be any one of the structures of the plurality of first water oxygen barrier bars 103 described above, which is not specifically limited herein. Since the structure of the first water oxygen barrier bar 103 has been described in detail in this embodiment, and the structure of the second water oxygen barrier bar 104 can refer to the structure of the first water oxygen barrier bar 103, the details will not be described again.

Further, referring to FIG. 2 and FIG. 8, the display panel may further include a first water oxygen barrier layer 105 disposed above the illuminating pixels 102. When the first water oxygen barrier bar 103 is disposed only in the peripheral region 10b, the first water oxygen barrier layer 105 may be located in a region defined by the first water oxygen barrier 103. Further, when the second water oxygen barrier bar 104 is additionally disposed between adjacent sub-pixels 102, the first water oxygen barrier layer 105 may be located in a region defined by the second water oxygen barrier bar 104 to form a plurality of first water oxygen barrier layers 105 arranged in the array.

In the embodiment, heights of the first water oxygen barrier bar 103 and the second water oxygen barrier bar 104 are both greater than a height of the illuminating pixels 102, and surfaces of the first water oxygen barrier bar 103 and the second water oxygen barrier bar 104 away from the substrate 101 are coplanar with the surface of the first water oxygen barrier layer 105 away from the substrate 101.

It should be understood that the present disclosure is not limited thereto. In other embodiments, the first water oxygen barrier layer 105 may be located not only in the region defined by the first water oxygen barrier bar 103 or the second water oxygen barrier 104, but also may cover the first water oxygen barrier bar 103 or the second water oxygen barrier bar 104. In this case, the surfaces of the first water oxygen barrier bar 103 and the second water oxygen barrier bar 104 away from the substrate 101 may be lower than the surface of the first water oxygen barrier layer 105 away from the substrate 101.

Figure 9:
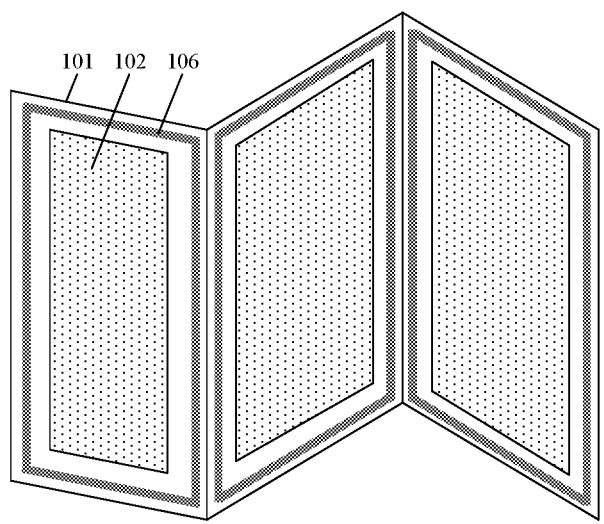
FIG. 9 is a schematic view showing a bent region of an OLED display panel in an exemplary embodiment of the present disclosure.

Further, when the OLED display panel includes a flexible substrate, as shown in FIG. 9, a third water oxygen barrier bar 106 may be further disposed in the bent region of the substrate 101, thereby preventing the water oxygen blocking structure from being warped or cracked due to bending or curling, to improve the performance of resisting water and oxygen of the OLED device.

It should be noted that, the shape structure of the third water oxygen barrier bar 106 of the bending region may refer to the shape structure of the first water oxygen barrier bar 103, and details are not described herein again.

Figure 10:
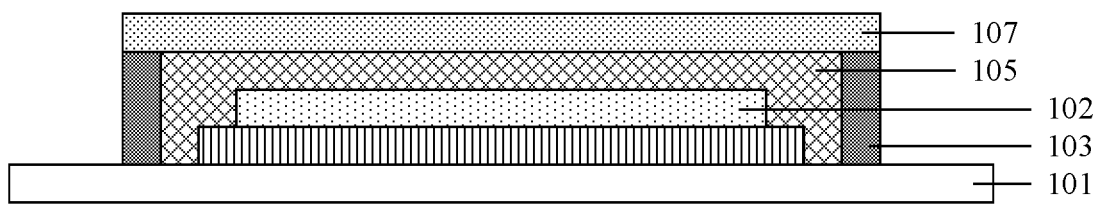
FIG. 10 is a first schematic cross-sectional view showing an OLED display panel in an exemplary embodiment of the present disclosure.
Figure 11:
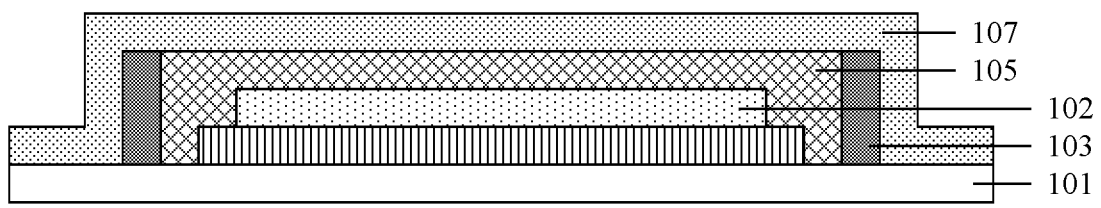
FIG. 11 is a second schematic cross-sectional view showing an OLED display panel in an exemplary embodiment of the present disclosure.

In the exemplary embodiment, as shown in FIG. 10 and FIG. 11, the display panel 10 may further include a second water oxygen barrier layer 107 disposed above the first water oxygen barrier layer 105.

Referring to FIG. 10, the second water oxygen barrier layer 107 may be covered on the upper side of the first water oxygen barrier layer 105 and the first water oxygen barrier bar 103. Alternatively, as shown in FIG. 11, the second water oxygen barrier layer 107 may be not only covered on the upper side of the first water oxygen barrier layer 105 and the first water oxygen barrier bar 103, but also may be covered on the lateral side of the first water oxygen barrier bar 103.

In this way, the arrangement of the second water oxygen barrier layer 107 can enhance the ability of the OLED display panel 10 to prevent moisture and oxygen from invading.

On this basis, materials of the first water oxygen barrier layer 105 and the second water oxygen barrier bar 104 may be organic materials, and materials of the second water oxygen barrier layer 107 and the first water oxygen barrier bar 103 may be inorganic materials. The material of the organic water oxygen barrier structure may include, but is not limited to, any one of hexamethyldisiloxane (pp-HMDSO), acrylic (Arcyl), aluminum-based organic-inorganic composite film (Alucone), OleDry-F, and poly-p-xylylene (Parylene). The material of the inorganic water oxygen barrier structure may include, but not limited to, any one of silicon oxide SiOx, silicon nitride SiNx, silicon dioxide $SiO_2$, silicon carbide SiC, silicon carbonitride SiCN, aluminum oxide $Al_2O_3$, and titanium dioxide $TiO_2$.

In this way, the first water oxygen barrier layer 105 and the second water oxygen barrier bar 104 are made of organic materials having a small stress, which can reduce the probability of the display region 10a being cracked due to bending. The second water oxygen barrier layer 107 and the first water oxygen barrier bar 103 are made of inorganic materials with strong ability of resisting water and oxygen, which can effectively ensure the effect of resisting water and oxygen of the OLED device. The combination of the water oxygen barrier layer and the water oxygen barrier bar not only obtains a good effect of preventing penetration of water and oxygen, but also facilitates preventing aging of the OLED device due to the crack of the first water oxygen barrier layer 105, thereby significantly improving the service life of the OLED device.

Figure 12:
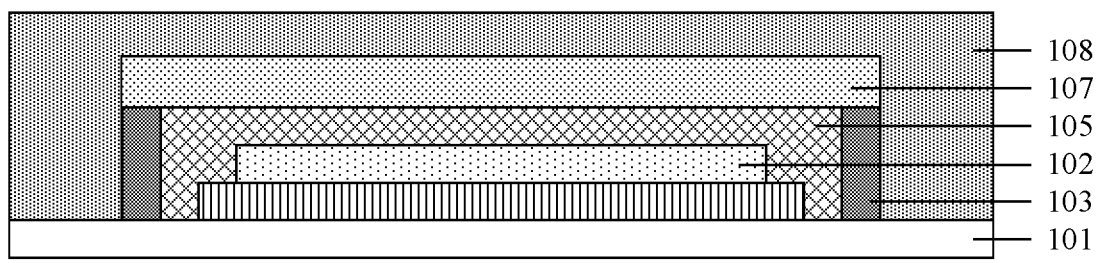
FIG. 12 is a third schematic cross-sectional view showing an OLED display panel in an exemplary embodiment of the present disclosure.
Figure 13:
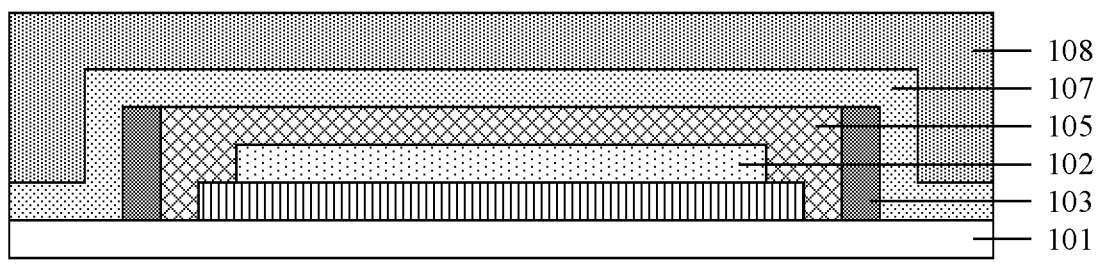
FIG. 13 is a fourth schematic cross-sectional view showing an OLED display panel in an exemplary embodiment of the present disclosure.

Further, as shown in FIG. 12 and FIG. 13, the OLED display panel 10 may further include a third water oxygen barrier layer 108 disposed above the second water oxygen barrier layer 107, and the third water oxygen barrier layer 108 may be coated on the upper side and the lateral side of the second water oxygen barrier layer 107. The material of the third water oxygen barrier layer 108 may be an organic material or an inorganic material, which is not specifically limited in this embodiment.

In this way, the arrangement of the third water oxygen barrier layer 108 can provide multiple packaging protection for the OLED display panel 10, thereby further enhancing the ability to prevent moisture and oxygen from invading.

Based on the above-described package structure, the present exemplary embodiment achieves the effect of preventing water and oxygen by providing a first water oxygen barrier bar 103 at the side of the OLED device and providing a plurality of water oxygen barrier layers above the OLED device. Since the first water barrier bar 103 is composed of the first sub-barrier bar 1031 and the second sub-barrier bar 1032, the first sub-barrier bar 1031 and the second sub-barrier bar 1032 may be disposed in the same layer, or the first sub-barrier bar 1031 and the second sub-barrier bar 1032 may also be disposed in different layers.

Figure 14:
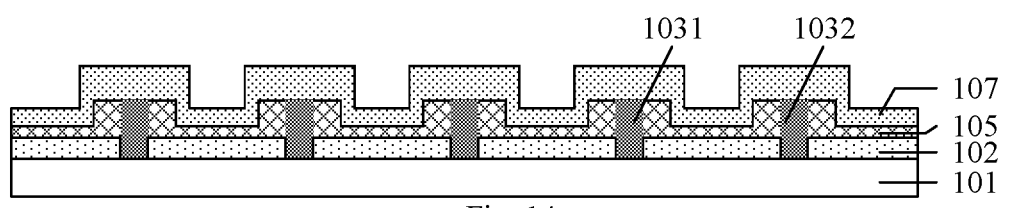
FIG. 14 is a schematic view showing a first arrangement of a water oxygen barrier bar in an exemplary embodiment of the present disclosure.

For example, FIG. 14 and FIG. 15 are schematic views of the first sub-barrier bar 1031 and the second sub-barrier bar 1032 disposed in the same layer. In this case, the first sub-barrier bar 1031 and the second sub-barrier bar 1032 may be disposed between the substrate 101 and the second water oxygen barrier layer 107 at the same time, and one or more layers of water oxygen barrier layers may be additionally disposed thereon.

As another example, FIG. 16 is a schematic view showing the first sub-barrier bar 1031 and the second sub-barrier bar 1032 disposed in different layers. In this case, the first sub-barrier bar 1031 may be disposed between the substrate 101 and the second water oxygen barrier layer 107, and the second sub-barrier bar 1032 may be disposed between the second water oxygen barrier layer 107 and the third water oxygen barrier layer 108, and vice versa.

In the present exemplary embodiment, the substrate 101 may be a rigid substrate or a flexible substrate covered with a water oxygen barrier film. The rigid substrate may be a glass substrate, a ceramic substrate, a metal substrate, or a silicon substrate. The flexible substrate may be a plastic substrate or a polymer substrate, such as polyimide (PI), Polyethylene Terephthalate (PET), and not limited thereto.

The illuminating pixel 102 can include a first electrode, a second electrode, and an organic light-emitting material layer therebetween. The organic light-emitting material layer may include an electron injection layer (EIL), an electron transport layer (ETL), an emission layer (EML), a hole transport layer (HTL), and a hole injection layer (HIL). The electron injection layer can be used to improve the efficiency of electron injection from the cathode. The electron transport layer can be used to enhance the transporting ability of the electrons. The emission layer is a location where electrons and holes recombine and excites to emit light. The hole transport layer can be used to enhance the transporting ability of the holes, and the hole injection layer can be used to increase the efficiency of hole injection from the anode.

The display panel may further include a thin film transistor corresponding to each of the illuminating pixels 102, for driving the OLED device in each of the illuminating pixels 102 to emit light. The thin film transistor may be an MOS (Metal Oxide Semiconductor) field effect transistor, such as an N-type MOS transistor or a P-type MOS transistor, which may specifically include a gate electrode, a gate insulating layer, a semiconductor active layer, a source electrode and a drain electrode. Among them, the material of the gate electrode, the source electrode and the drain electrode may be selected from molybdenum Mo, silver Ag, aluminum Al, titanium Ti, copper Cu, gold Au, magnesium silver alloy MgAg, neodymium aluminum alloy AlNd, molybdenum tungsten alloy MoW, molybdenum alloy, silver alloy, copper alloy, titanium alloy, or aluminum alloy. The material of the semiconductor active layer may be amorphous silicon, polycrystalline silicon, single crystal silicon, or oxide semiconductor material, or the like.

The example embodiment further provides a method for preparing an OLED display panel for preparing the OLED display panel described above. As shown in FIG. 17, the preparation method may include the following:

S01, forming a plurality of illuminating pixels 102 arranged in an array in a display region 10a above the substrate 101; and S02, forming a first water oxygen barrier bar 103 in a peripheral region 10b above the substrate 101.

In the embodiment, the first water oxygen barrier bar 103 may include a plurality of first sub-barrier bars 1031 arranged intermittently and a plurality of second sub-barrier bars 1032 arranged intermittently, and the first sub-barrier bars 1031 and the second sub-barrier bars 1032 are interlaced with each other. In a direction perpendicular to an arrangement direction of the first sub-barrier bars 1031, a gap between adjacent first sub-barrier bars 1031 is blocked by one of the second sub-barriers 1032, and a gap between adjacent second sub-barrier bars 1032 is blocked by one of the first sub-barriers 1031.

Based on this, the preparation method may further include the following:

S03, forming a second water oxygen barrier bar 104 in a region between adjacent illuminating pixels 102.

In the embodiment, the second water oxygen barrier bar 104 and the first water oxygen barrier bar 103 may have the same structure and be formed by the same patterning process.

It should be noted that the specific details of the method of preparing the OLED display panel have been described in detail in the corresponding OLED display panel, and details are not described herein again.

In the method of preparing the OLED display panel provided by the exemplary embodiment of the present disclosure, by providing alternatively arranged first sub-barrier bars 1031 and second sub-barrier bars 1032 in its peripheral region 10b, a water oxygen blocking structure can be constructed for a side of the OLED device. In this way, the capability of resisting water and oxygen of the OLED display panel can be effectively improved; besides, the first sub-barrier bars 1031 and the second sub-barrier bars 1032 are all intermittent structures, so the water oxygen blocking structure can be effectively prevented from being warped or cracked due to the bending stress, thereby improving the service life of the OLED device.

Several specific embodiments are provided below to exemplify the preparation method of the OLED display panel.

Figure 18:
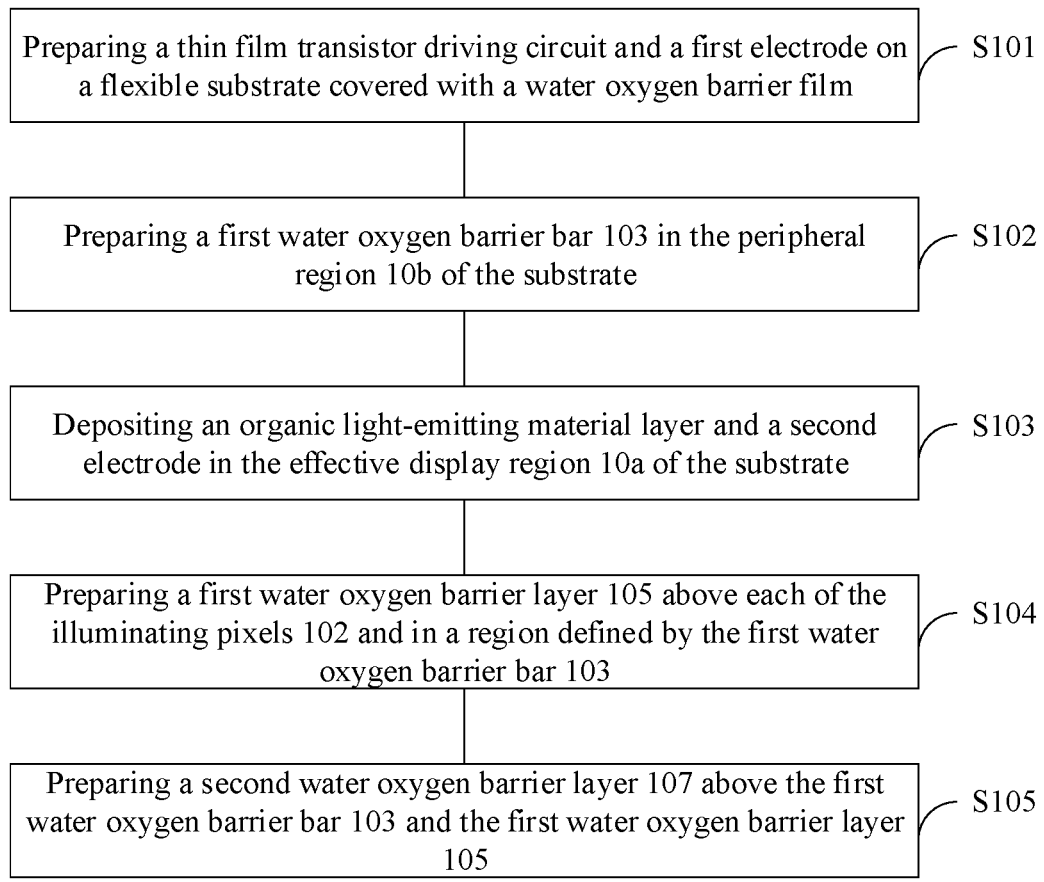
FIG. 18 schematically showing a flow chart of a method of preparing an OLED display panel in an exemplary embodiment of the present disclosure.

In the first embodiment, as shown in FIG. 18, the method for preparing the OLED display panel may include the following:

S101, preparing a thin film transistor driving circuit and a first electrode on a flexible substrate covered with a water oxygen barrier film;

S102, preparing a first water oxygen barrier bar 103 in the peripheral region 10b of the substrate;

S103, depositing an organic light-emitting material layer and a second electrode in the display region 10a of the substrate;

S104, preparing a first water oxygen barrier layer 105 above each of the illuminating pixels 102 and in a region defined by the first water oxygen barrier bar 103; and S105, preparing a second water oxygen barrier layer 107 above the first water oxygen barrier bar 103 and the first water oxygen barrier layer 105.

Based on the above, the OLED display panel shown in FIG. 10 or FIG. 11 can be obtained.

Figure 19:
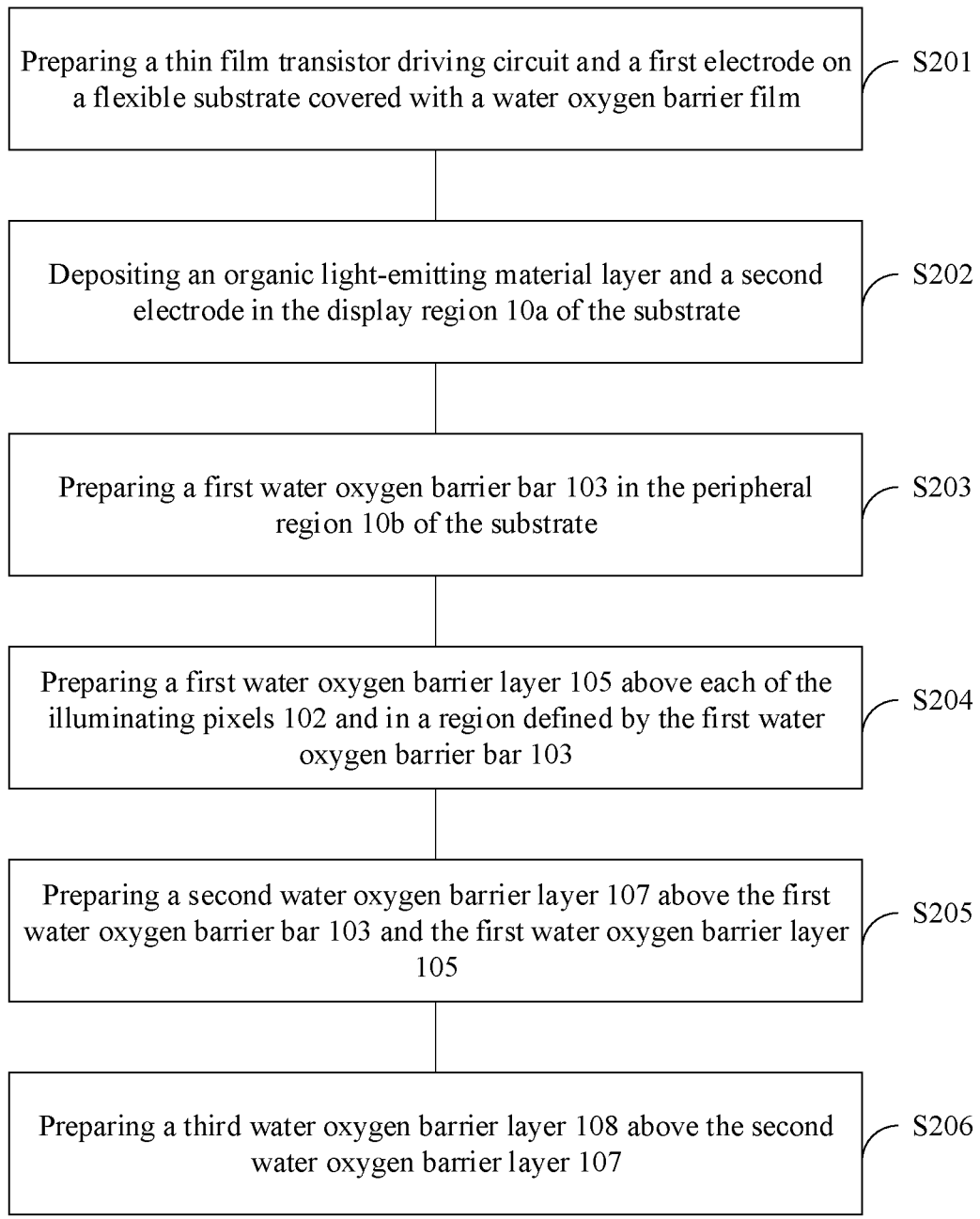
FIG. 19 schematically showing a flow chart of a method of preparing an OLED display panel in another exemplary embodiment of the present disclosure.

In the second embodiment, as shown in FIG. 19, the method for preparing the OLED display panel may include the following:

S201, preparing a thin film transistor driving circuit and a first electrode on a flexible substrate covered with a water oxygen barrier film;

S202, depositing an organic light-emitting material layer and a second electrode in the display region 10a of the substrate;

S203, preparing a first water oxygen barrier bar 103 in the peripheral region 10b of the substrate;

S204, preparing a first water oxygen barrier layer 105 above each of the illuminating pixels 102 and in a region defined by the first water oxygen barrier bar 103;

S205, preparing a second water oxygen barrier layer 107 above the first water oxygen barrier bar 103 and the first water oxygen barrier layer 105; and S206, preparing a third water oxygen barrier layer 108 above the second water oxygen barrier layer 107.

Based on the above, the OLED display panel shown in FIG. 12 can be obtained.

Figure 20:
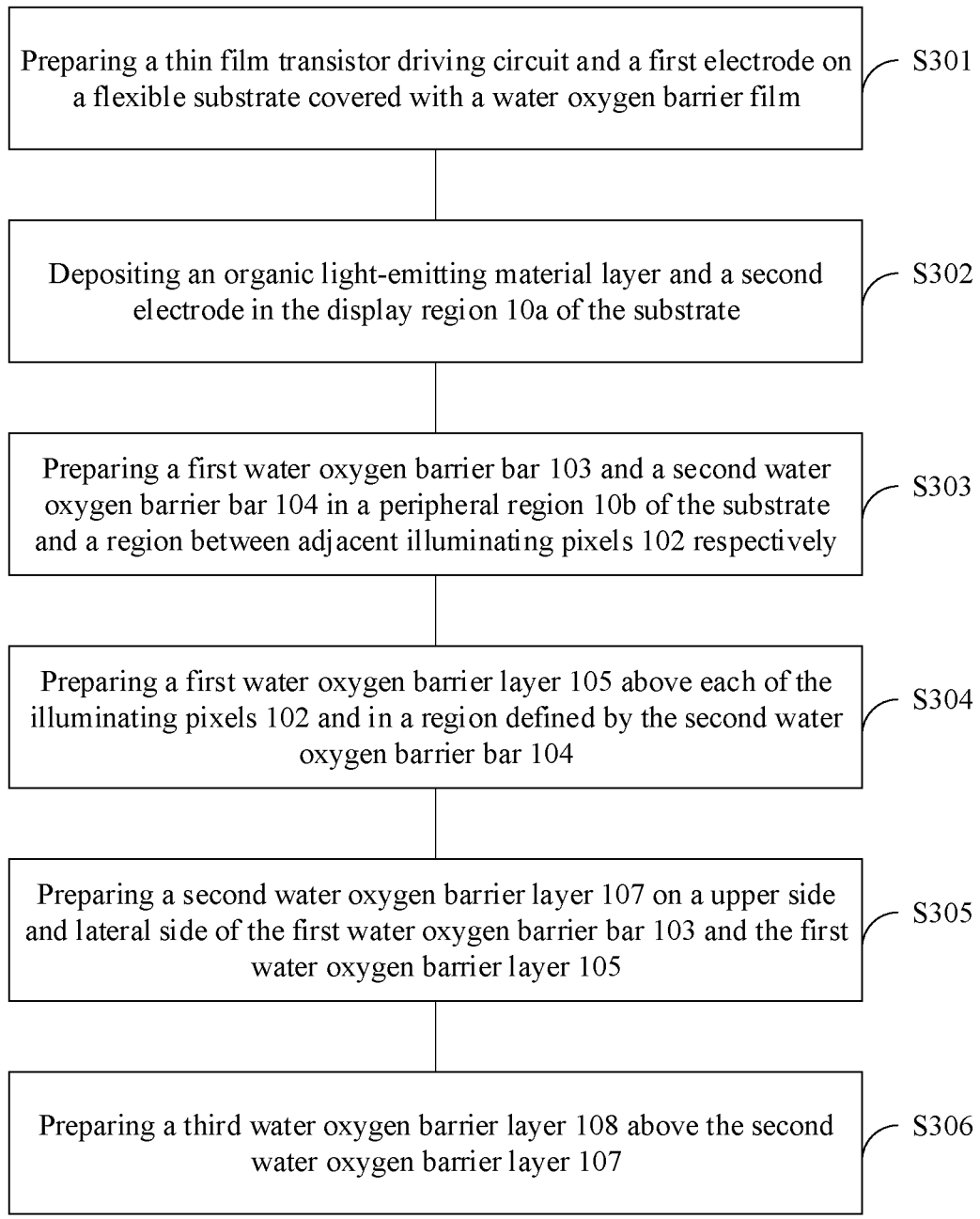
FIG. 20 schematically showing a flow chart of a method of preparing an OLED display panel in still another exemplary embodiment of the present disclosure.

In a third embodiment, as shown in FIG. 20, the method for preparing the OLED display panel may include the following:

S301, preparing a thin film transistor driving circuit and a first electrode on a flexible substrate covered with a water oxygen barrier film;

S302, depositing an organic light-emitting material layer and a second electrode in the display region 10a of the substrate;

S303, preparing a first water oxygen barrier bar 103 and a second water oxygen barrier bar 104 in a peripheral region 10b of the substrate and a region between adjacent illuminating pixels 102 respectively;

S304, preparing a first water oxygen barrier layer 105 above each of the illuminating pixels 102 and in a region defined by the second water oxygen barrier bar 104;

S305, preparing a second water oxygen barrier layer 107 on an upper side and lateral side of the first water oxygen barrier bar 103 and the first water oxygen barrier layer 105; and S306, preparing a third water oxygen barrier layer 108 above the second water oxygen barrier layer 107.

Based on the above, the OLED display panel shown in FIG. 13 can be obtained.

It should be noted that the preparation process of the OLED display panel provided by the present exemplary embodiment is not limited to the above embodiments, and any solution that conforms to the technical idea of the present disclosure is within the scope of protection.

The example embodiment further provides a display device including the above OLED display panel. The display device has better performance of resisting water and oxygen at the side and better bending resistance than conventional OLED devices, and is particularly suitable for flexible display devices.

The display device may include any product or component having a display function, such as a mobile phone, a tablet computer, a television, a notebook computer, a digital photo frame, a navigator, etc., which is not specifically limited in the present disclosure.

In the OLED display panel and the preparation method thereof provided by the exemplary embodiment of the present disclosure, by providing a first water oxygen barrier bar composed of alternatively arranged first sub-barrier bars and second sub-barrier bars in a peripheral region, a water oxygen blocking structure can be constructed for a side of the OLED device. On the one hand, since the first water oxygen barrier bar is disposed in the peripheral region of the display panel, capability of resisting water and oxygen at a side of the OLED device can be effectively improved; on the other hand, the first sub-barrier bars and the second sub-barrier bars are all intermittent structures, so the water oxygen blocking structure can be effectively prevented from being warped or cracked due to the bending stress, thereby improving the service life of the OLED device.

Those skilled in the art will easily conceive other embodiments of the present disclosure after considering the specification and practicing the content disclosed herein. This application is intended to cover any variations, uses, or adaptations of the disclosure. These variations, uses, or adaptations are subject to the general principles of the present disclosure and include common general knowledge or conventional technical means in the art that are not disclosed in the present disclosure. The specification and examples are to be regarded as illustrative only, and the true scope and spirit of the disclosure is pointed out by the appended claims.

It is to be understood that the present disclosure is not limited to the precise structures that have been described above and illustrated in the drawings, and various modifications and changes can be made without departing from the scope thereof. The scope of the disclosure is limited only by the appended claims.

What is claimed is:

1. A display panel, comprising a display region and a peripheral region; the display panel further comprising:
   a substrate;
   a plurality of illuminating pixels arranged in an array above the substrate and located in the display region; and
   a first water oxygen barrier bar disposed above the substrate and located in the peripheral region,
   wherein the first water oxygen barrier bar comprises a plurality of first sub-barrier bars arranged intermittently and a plurality of second sub-barrier bars arranged intermittently; in a direction perpendicular to an arrangement direction of the first sub-barrier bars, a gap between adjacent first sub-barrier bars and a gap between adjacent second sub-barrier bars are not aligned with each other,
   wherein the display panel further comprises a second water oxygen barrier bar disposed between adjacent illuminating pixels, and the second water oxygen barrier bar and the first water oxygen barrier bar have a substantially identical arrangement,
   wherein the display panel further comprises: a first water oxygen barrier layer, disposed above the illuminating pixels and located in a region defined by the second water oxygen barrier bar, and
   wherein a height of the second water oxygen barrier bar is greater than that of the illuminating pixels, and a surface of the second water oxygen barrier bar away from the substrate and a surface of the first water oxygen barrier layer away from the substrate are coplanar.

2. The display panel according to claim 1, wherein in the direction perpendicular to the arrangement direction of the first sub-barrier bars, the gap between adjacent first sub-barrier bars is aligned with one of the second sub-barrier bars, and the gap between adjacent second sub-barrier bars is aligned with one of the first sub-barrier bars.

3. The display panel according to claim 1, wherein the first water oxygen barrier bar and the second water oxygen barrier bar are disposed in an identical layer and have an identical material.

4. The display panel according to claim 1, wherein the display region is completely surrounded by the first water oxygen barrier bar.

5. The display panel according to claim 1, wherein the illuminating pixels are completely surrounded by the second water oxygen barrier bar.

6. The display panel according to claim 1, wherein the first sub-barrier bar and the second sub-barrier bar have an identical shape and are arranged parallelly and oppositely,
   wherein the shape of the first sub-barrier bar and the second sub-barrier bar comprises any one of a strip type, a C type, and an angle bracket type.

7. The display panel according to claim 1, wherein the first sub-barrier bar and the second sub-barrier bar have an identical shape and are arranged successively in an identical row;
   wherein the shape of the first sub-barrier bar and the second sub-barrier bar comprises any one of an S type and an inverted-Z shape.

8. The display panel according to claim 1, wherein the first sub-barrier bar and the second sub-barrier bar are disposed in an identical layer.

9. The display panel according to claim 1, wherein the first sub-barrier bar and the second sub-barrier bar are disposed in different layers.

10. A display panel, comprising a display region and a peripheral region; the display panel further comprising:
    a substrate;
    a plurality of illuminating pixels arranged in an array above the substrate and located in the display region; and
    a first water oxygen barrier bar disposed above the substrate and located in the peripheral region,
    wherein the first water oxygen barrier bar comprises a plurality of first sub-barrier bars arranged intermittently and a plurality of second sub-barrier bars arranged intermittently; in a direction perpendicular to an arrangement direction of the first sub-barrier bars, a gap between adjacent first sub-barrier bars and a gap between adjacent second sub-barrier bars are not aligned with each other,
    wherein the display panel further comprises a second water oxygen barrier bar disposed between adjacent illuminating pixels, and the second water oxygen barrier bar and the first water oxygen barrier bar have a substantially identical arrangement,
    wherein the display panel further comprises:
    a first water oxygen barrier layer, disposed above the illuminating pixels and located in a region defined by the second water oxygen barrier bar; and
    a second water oxygen barrier layer disposed above the first water oxygen barrier layer.

11. The display panel according to claim 10, wherein each of the first water oxygen barrier layer and the second water oxygen barrier bar contains organic materials, and each of the second water oxygen barrier layer and the first water oxygen barrier bar contains inorganic materials.

12. The display panel according to claim 10, wherein the display panel further comprises:
    a third water oxygen barrier layer, disposed above the second water oxygen barrier layer,
    wherein the third water oxygen barrier layer comprises organic materials or inorganic materials.

13. A display device, comprising the display panel of claim 1.

14. A method of preparing a display panel, comprising:
    forming a plurality of illuminating pixels arranged in an array in a display region above a substrate; and
    forming a first water oxygen barrier bar in a peripheral region above the substrate,
    wherein the first water oxygen barrier bar comprises a plurality of first sub-barrier bars arranged intermittently and a plurality of second sub-barrier bars arranged intermittently; in a direction perpendicular to an arrangement direction of the first sub-barrier bars, a gap between adjacent first sub-barrier bars and a gap between adjacent second sub-barrier bars are not aligned with each other,
    wherein the method further comprises:

forming a second water oxygen barrier bar in a region between adjacent illuminating pixels, wherein the second water oxygen barrier bar and the first water oxygen barrier bar have a substantially identical arrangement; and forming a first water oxygen barrier layer above the illuminating pixels and located in a region defined by the second water oxygen barrier bar, wherein a height of the second water oxygen barrier bar is greater than that of the illuminating pixels, and a surface of the second water oxygen barrier bar away from the substrate and a surface of the first water oxygen barrier layer away from the substrate are coplanar.

15. The preparation method according to claim 14, wherein the gap between adjacent first sub-barrier bars is formed to be aligned with one of the second sub-barrier bars, and the gap between adjacent second sub-barrier bars is formed to be aligned with one of the first sub-barrier bars.

16. The preparation method according to claim 14, wherein the first water oxygen barrier bar and the second water oxygen barrier bar are formed by an identical patterning process.

* * * * *